(12) United States Patent
Nelms et al.

(10) Patent No.: US 11,949,222 B2
(45) Date of Patent: Apr. 2, 2024

(54) SAMPLE TIME OFFSET ALIGNMENT OF ELECTRIC POWER SYSTEM SAMPLES INDEPENDENT OF A COMMON TIME SOURCE

(71) Applicant: Schweitzer Engineering Laboratories, Inc., Pullman, WA (US)

(72) Inventors: Lisa Gayle Nelms, Colfax, WA (US); Tony J. Lee, Henderson, NV (US); Bryon S. Bridges, Liberty Lake, WA (US); Derek Lautenschlager, Palouse, WA (US); Guillermo Ramirez Conejo, Pullman, WA (US); Stephanie L. McDaid, Kennewick, WA (US); Nishchal Sharma, Pullman, WA (US); Bharat Nalla, Pullman, WA (US); Vinodev E. Rajasekaran, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 245 days.

(21) Appl. No.: 17/456,936

(22) Filed: Nov. 30, 2021

(65) Prior Publication Data
US 2022/0239089 A1 Jul. 28, 2022

Related U.S. Application Data

(60) Provisional application No. 63/141,766, filed on Jan. 26, 2021.

(51) Int. Cl.
*H02H 1/00* (2006.01)
*G01R 31/08* (2020.01)
*H02H 3/05* (2006.01)
*H02H 3/16* (2006.01)
*H02J 13/00* (2006.01)

(52) U.S. Cl.
CPC ............ *H02H 1/0061* (2013.01); *H02H 3/05* (2013.01); *H02H 3/16* (2013.01); *H02J 13/0004* (2020.01); *G01R 31/085* (2013.01)

(58) Field of Classification Search
CPC ..... G01R 19/2513; G01R 21/06; G01R 31/00
See application file for complete search history.

(56) References Cited

U.S. PATENT DOCUMENTS

| | | |
|---|---|---|
| 5,793,750 A | 8/1998 | Schweitzer |
| 6,847,297 B2 | 1/2005 | Lavoie |
| 6,940,935 B2 | 9/2005 | Lee |
| 6,999,291 B2 | 2/2006 | Andarawis |
| 7,058,482 B2 | 6/2006 | Fletcher |

(Continued)

*Primary Examiner* — Jermele M Hollington
*Assistant Examiner* — Temilade S Rhodes-Vivour
(74) *Attorney, Agent, or Firm* — Richard M. Edge

(57) ABSTRACT

Disclosed herein is a system for time aligning electric power system measurements at an intelligent electronic device (IED) using samples and sample time offset from merging units. The merging units do not require access to a common time signal. The IED does not require storage of a communication latency with the merging units. The sample time offset corresponds to a latency between obtaining the sample and receipt of the sample at the IED. The IED aligns samples from various merging units using sample time offset values communicated from the merging units to the IED. The IED performs monitoring and protection functions using the time aligned samples.

20 Claims, 9 Drawing Sheets

(56) References Cited

U.S. PATENT DOCUMENTS

| | | | |
|---|---|---|---|
| 7,231,003 B2 | 6/2007 | Lee | |
| 8,275,485 B2 | 9/2012 | Schweitzer | |
| 8,275,486 B2 | 9/2012 | Schweitzer | |
| 8,275,487 B2 | 9/2012 | Schweitzer | |
| 8,682,496 B2 | 3/2014 | Schweitzer | |
| 9,383,735 B2 | 7/2016 | Schweitzer | |
| 9,401,839 B2 | 7/2016 | Kidwell | |
| 9,568,516 B2 | 2/2017 | Gubba Ravikumar | |
| 10,333,301 B2 | 6/2019 | Gubba Ravikumar | |
| 10,859,611 B2 | 12/2020 | Yang | |
| 10,979,330 B2 | 4/2021 | Rajasekaran | |
| 10,992,134 B2 | 4/2021 | Cai | |
| 2004/0107025 A1* | 6/2004 | Ransom | G06Q 50/06 700/286 |
| 2005/0206530 A1* | 9/2005 | Cumming | G01D 4/006 700/295 |
| 2006/0224336 A1* | 10/2006 | Petras | H04L 12/66 702/62 |
| 2008/0071482 A1* | 3/2008 | Zweigle | G01R 19/2513 702/62 |
| 2014/0074415 A1 | 3/2014 | Rudolph | |
| 2020/0333767 A1* | 10/2020 | Engelstein | H04Q 9/00 |

* cited by examiner

_US 11,949,222 B2_

SAMPLE TIME OFFSET ALIGNMENT OF ELECTRIC POWER SYSTEM SAMPLES INDEPENDENT OF A COMMON TIME SOURCE

RELATED APPLICATION

This application claims priority from and benefit of U.S. Provisional Application Ser. No. 63/141,766, filed on 26 Jan. 2021, entitled "Sample Time Offset Alignment of Electric Power System Samples Independent of a Common Time Source," which is hereby incorporated by reference in its entirety.

TECHNICAL FIELD

This disclosure relates to time alignment of communicated power system samples. More particularly, this disclosure relates to an intelligent electronic device (IED) that receives electric power system samples from merging units without communicating time stamps of the samples.

BRIEF DESCRIPTION OF THE DRAWINGS

Non-limiting and non-exhaustive embodiments of the disclosure are described, including various embodiments of the disclosure with reference to the figures.

DETAILED DESCRIPTION

Figure 1:
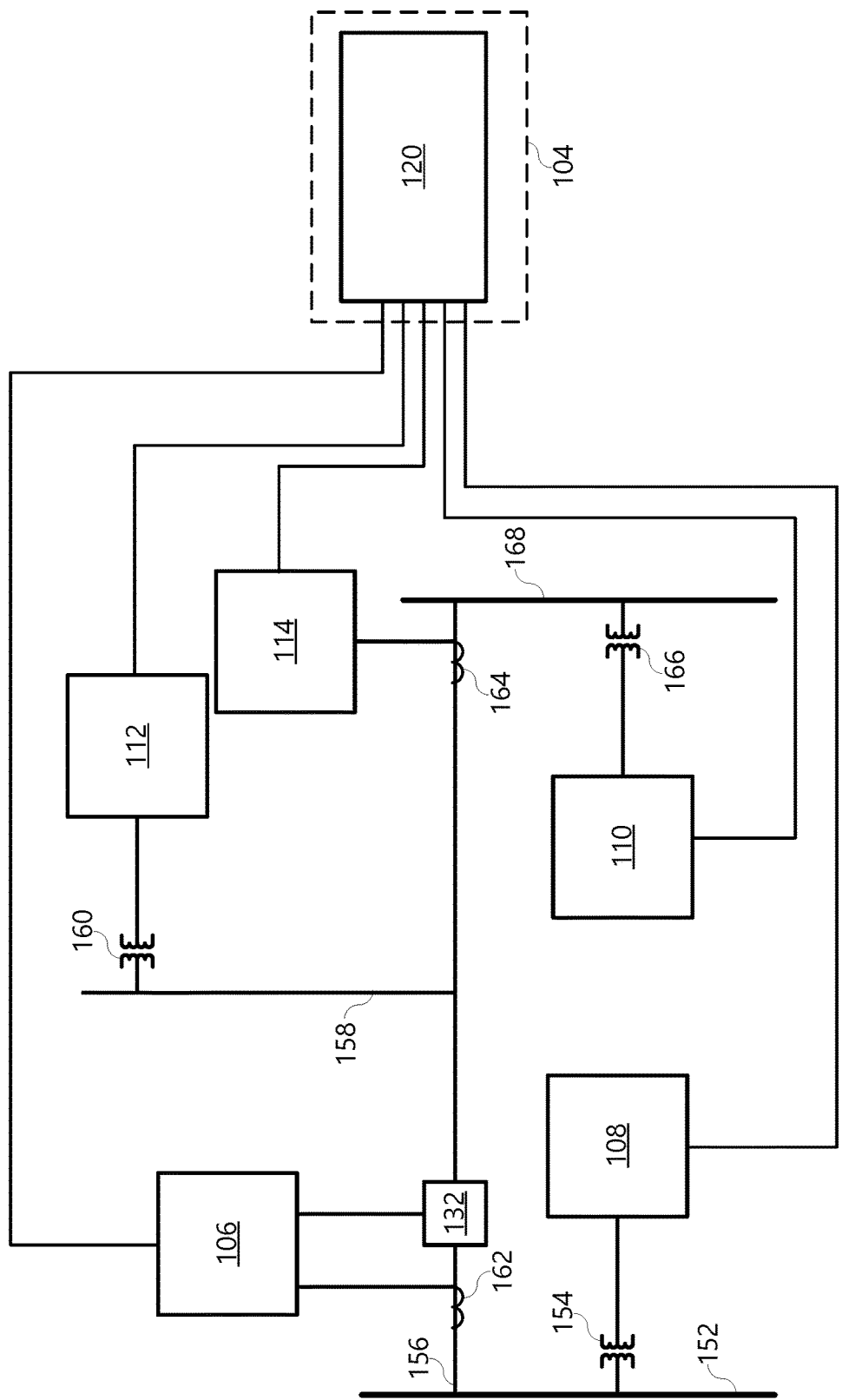
FIG. 1 illustrates a simplified one-line diagram of an electric power delivery system including merging units and an intelligent electronic device (IED), in accordance with various embodiments.

Electric power delivery systems are widely used in facilitation of generation, transmission, distribution, and consumption of electric power. Such systems include a wide variety of equipment specifically designed for the purposes of electric power delivery. Such equipment is, at times, subject to conditions outside of the specified operating parameters thereof, which may result in the interruption of generation, delivery, or consumption of electric power. In order to mitigate against or avoid such conditions, electric power delivery equipment and systems of equipment are often monitored using intelligent electronic devices (IEDs) that gather information from the equipment, determine operating conditions, and take an action if the determined operating conditions are outside of acceptable parameters.

For example, a three-phase electric power transmission line of an electric power delivery system may be used to carry electric power on separate conductors over long distances at a high voltage. The conductors are insulated from each other and the ground. A failure of the insulation may occur for multiple reasons resulting in one conductor coming into electrical contact with another conductor or the ground. Such a failure is commonly referred as a fault. An IED may be used to monitor such transmission line by obtaining electrical information from the transmission line such as, for example, voltages and currents of the transmission line. The IED may obtain the electrical information from one end or both ends of the transmission line, and may operate to detect fault conditions on the transmission line. If a fault condition is detected, the IED may command a circuit breaker to open, removing electric power from the transmission line. Monitoring, detecting faults, and commanding a protective action using information from both ends of the line may be performed using a differential element of the IED.

In some implementations, the IED may obtain electric power system signals from multiple power system locations or equipment to apply monitoring and protection to the electric power system. The IED may obtain the signals directly from instrument transformers such as current transformers (CTs), potential transformers (PTs), Rogowski coils, or the like, which are in electrical communication with the electric power system. Such implementations may require electrical (e.g. copper) connections between instrument transformers and the IED. Such implementations use a large amount of wiring, connections, and the like, which increases complexity and reduces safety.

Alternatively and/or additionally, merging units may be used to obtain signals from instrument transformers, sample and digitize the analog signals, and communicate the digitized analog signals back to the IED using, for example, fiber-optic media. Although in some implementations the term "merging unit" may be associated with certain protocols, the use of the term "merging unit" herein includes any device configured to obtain electric power delivery system information from primary equipment and transmitting communications that include obtained electric power delivery system information to a device for electric power system protection, automation, and/or monitoring. Merging units herein may operate in accordance with certain protocols such as IEC-61850, or may operate outside of such protocols. Merging units herein may further be configured to transmit control signals (such as, for example, trip, close, and open signals) to primary equipment. Control signals may be in response to a command received by the merging unit from another device.

Because the merging units may be located at different distances from the IED or use different media in communication, communications from the merging units may arrive at the IED after different delays. Further, sampling at the merging units may occur at different times. For proper monitoring and protection, the IED may require that the samples be aligned by the time that the samples are made, even if the samples are taken at different locations or are associated with different power system equipment. One way to account for such differences in delays is to supply each merging unit and the IED with a common time source such as, for example, a time signal from a global navigation satellite system (GNSS) such as GPS, or the like. Each merging unit may then time stamp each sample and communicate the digitized analog samples along with time stamps for time alignment at the IED.

However, adding common time signals at each device increases complexity. For example, each merging unit may communicate the quantity and the associated time stamp with each sample, thereby increasing complexity of communicating the sample data. Using a common time source also increases vulnerability due to possible unavailability of an acceptable time source.

An alternative solution is for the IED to measure communication channel delay to each associated merging unit, and use the measured channel delay to properly align the samples from each different merging unit. That is, the IED may apply a time stamp to each received sample, where the time stamp is adjusted by the measured channel delay for the particular merging unit. However, this adds complexity to the IED in measuring channel delays, storing channel delays, and applying channel delays to the samples. Furthermore, this complexity is multiplied when the IED receives samples from multiple merging units, each of which has its own channel delay. The application of channel delays also adds processing time and complexity to every received sample.

Accordingly, what is needed is a system for obtaining power system signals at an IED independent of a common time signal at each merging unit, and without the complexity of the IED measuring and applying channel delays to each received sample.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module, element, or component may, for instance, comprise one or more physical or logical blocks of computer instructions, which may be organized as a routine, program, object, component, data structure, etc., that performs one or more tasks or implements particular abstract data types.

In certain embodiments, a particular software module, element, or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an electric power delivery system that includes buses 152 and 168 connected using line 156, which feeds a branch 158. Voltages from bus 152 are sampled using merging unit 108 and a PT 154. Voltages from bus 168 are sampled using merging unit 110 and a PT 166. Currents at each end of line 156 are sampled using merging units 106 and 114 in communication with CTs 162 and 164, respectively. Voltages on the branch 158 are sampled using merging unit 112 and a PT 160. The merging units may be at different locations or within the same switchyard. The merging units are in communication with IED 120, with each merging unit being connected with the IED 120 with a separate physical media for point-to-point communication with the IED 120.

In various embodiments, IED 120 may control operations of equipment on the electric power delivery system using the merging units. For example, merging unit 106 may be in communication with breaker 132. Upon a command from IED 120, merging unit 106 may command breaker 132 to open and/or close. As described herein, communications from the IED 120 to the merging unit 106 may be messages to the merging unit with a binary signal to operate the breaker. Such hardware accelerated messages improve the speed of communication and, thereby, also improve the speed of protection. IED 120 may be within a substation or control enclosure 104. IED 120 may receive and send communications with the merging units using the various communication media as illustrated which may include, for example, fiber optic communications. To improve monitoring and protection by the IED 120, it is desired that samples from each of the merging units be arranged according to the time at which the sample was obtained to represent the state of the electric power delivery system at those times. As suggested above, the lengths of each of the fiber optic cables may be different, or the media may vary such that the communication delay times from each of the merging units may be different. In accordance with previous systems, each merging unit must also receive a common time, and apply a time stamp to each sample communicated to the IED. Alternatively, the IED may account for these different communication delays by associating the digitized samples with an estimated time at which the sample was measured by the merging unit, which eliminates the need to communicate a time stamp with each sample from each merging unit.

As described in more detail below, the present disclosure is an improvement to the previous systems and methods by being independent of a common time source, reducing complexity, and decreasing processing delays. In accordance with several embodiments herein, each merging unit calculates the channel delay between the merging unit and the IED. When sending a communication that includes the sample, the merging unit includes a sample offset that is associated with one or more of the delays that affect communication such as, for example, the channel delay, processing delays and the like. The IED uses the sample offsets associated with samples received from several merging units to align the samples. The merging units update the channel delay periodically using an automatic response that is transmitted from the IED immediately upon receipt of the sample from the merging unit.

Figure 2:
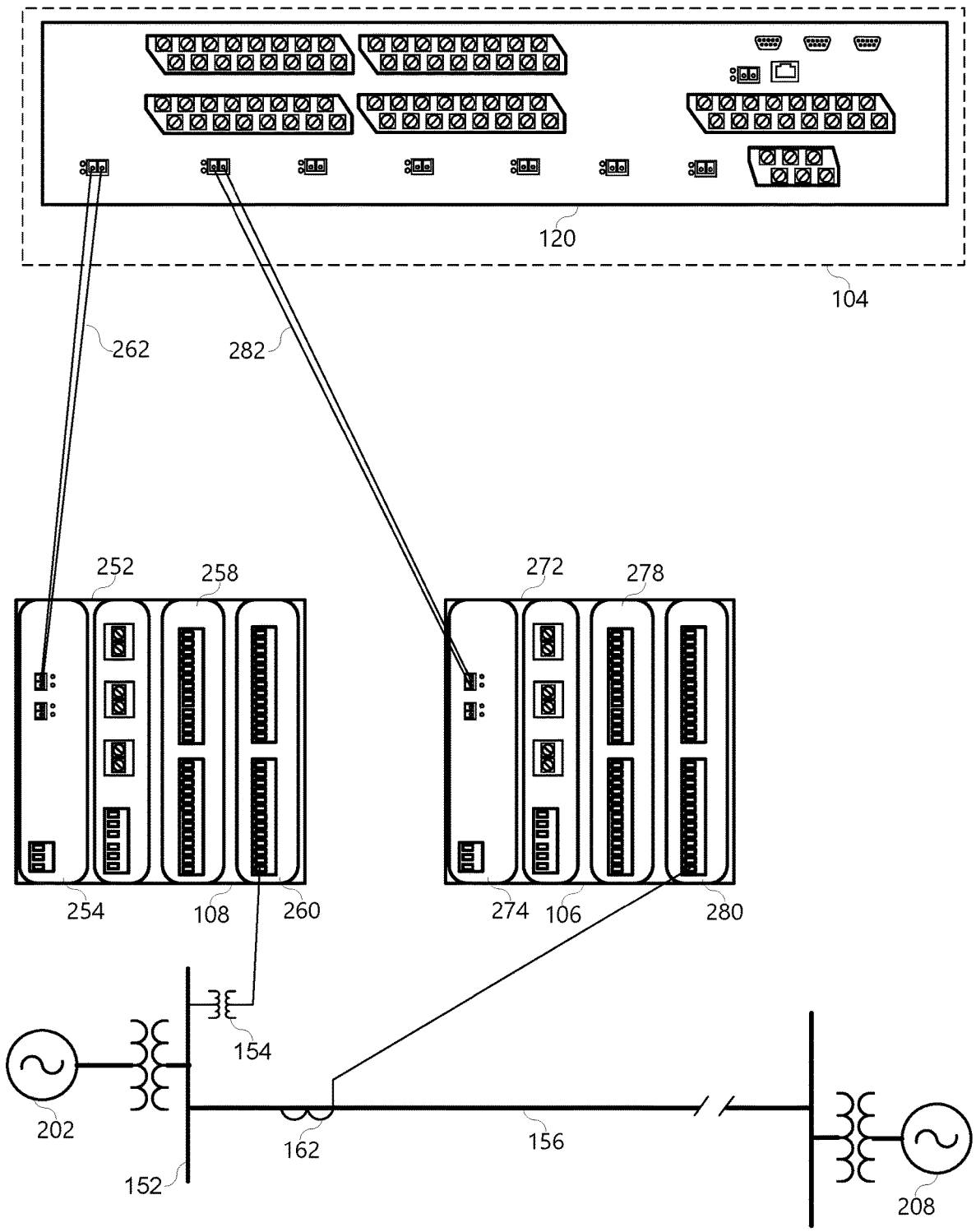
FIG. 2 illustrates a simplified block diagram of an electric power system protection device in communication with merging units for obtaining electric power system signals from the electric power system, in accordance with various embodiments.

FIG. 2 illustrates a simplified block diagram of a system for protection of an electric power delivery system, including obtaining electric power system signals from a number of merging units. Specifically, illustrated is a simplified one-line diagram of an electric power delivery system that includes generation 202 and 208 at different ends of a transmission line 156. Instrument transformers 154 and 162 are at different locations on the electric power delivery system and may provide power system signals to merging units 252 and 272, respectively.

Merging unit 252 may be located in a first substation near the instrument transformer(s) 154 for obtaining electric power delivery system signals from a first location, sampling and digitizing the signals, and communicating the digitized signals to IED 120. Merging unit 272 may be located in a second substation near the instrument transformer(s) 162 for obtaining electric power delivery system signals from a second location, sampling and digitizing the signals, and communicating the digitized signals to IED 120. The merging unit 252 may include various input and/or output modules 258, 260 to obtain signals. As illustrated, input module 260 is in electrical communication with instrument transformer 154. Module 254 is in communication with the IED 120 to send digitized signals to the IED 120 and receive communications from the IED 120.

Similarly, merging unit 272 may include various input and/or output modules 278 and 280 to obtain signals. As illustrated, input module 280 is in electrical communication with instrument transformer 162. Module 274 is in communication with the IED 120 to send digitized signals to and receive communications from the IED 120.

In normal operation, the merging units 252 and 272 obtain electric power system signals from a first location and a second location using instrument transformers 154 and 162. The merging units 252 and 272 sample and digitize the electric power system signals and communicate the signals to IED 120. The IED 120 may perform monitoring and protection functions, such as differential protection of the electric power delivery system, using the power system signals from the first location and from the second location. Upon detection of a fault, the IED 120 may send a command to one or both of the merging units 252 and 272 to perform a protective function such as opening a circuit breaker.

Merging unit 252 may provide communications to IED 120 using communication medium 262; and merging unit 272 may provide communications to IED 120 using communication medium 282. Communication media 262 and 282 may be different lengths or may be composed of different material. Such factors affect the time communication takes to travel between the merging unit and the IED. Accordingly, the communication from one merging unit may take a different amount of time than communication from another merging unit. It should be noted that the illustrated embodiment does not include a switched communication network between the various merging units and the IED consuming data from those merging units. According to the illustrated embodiment, communications between the IED and the merging units is a point-to-point communication without any intermediate communication switches.

Figure 3:
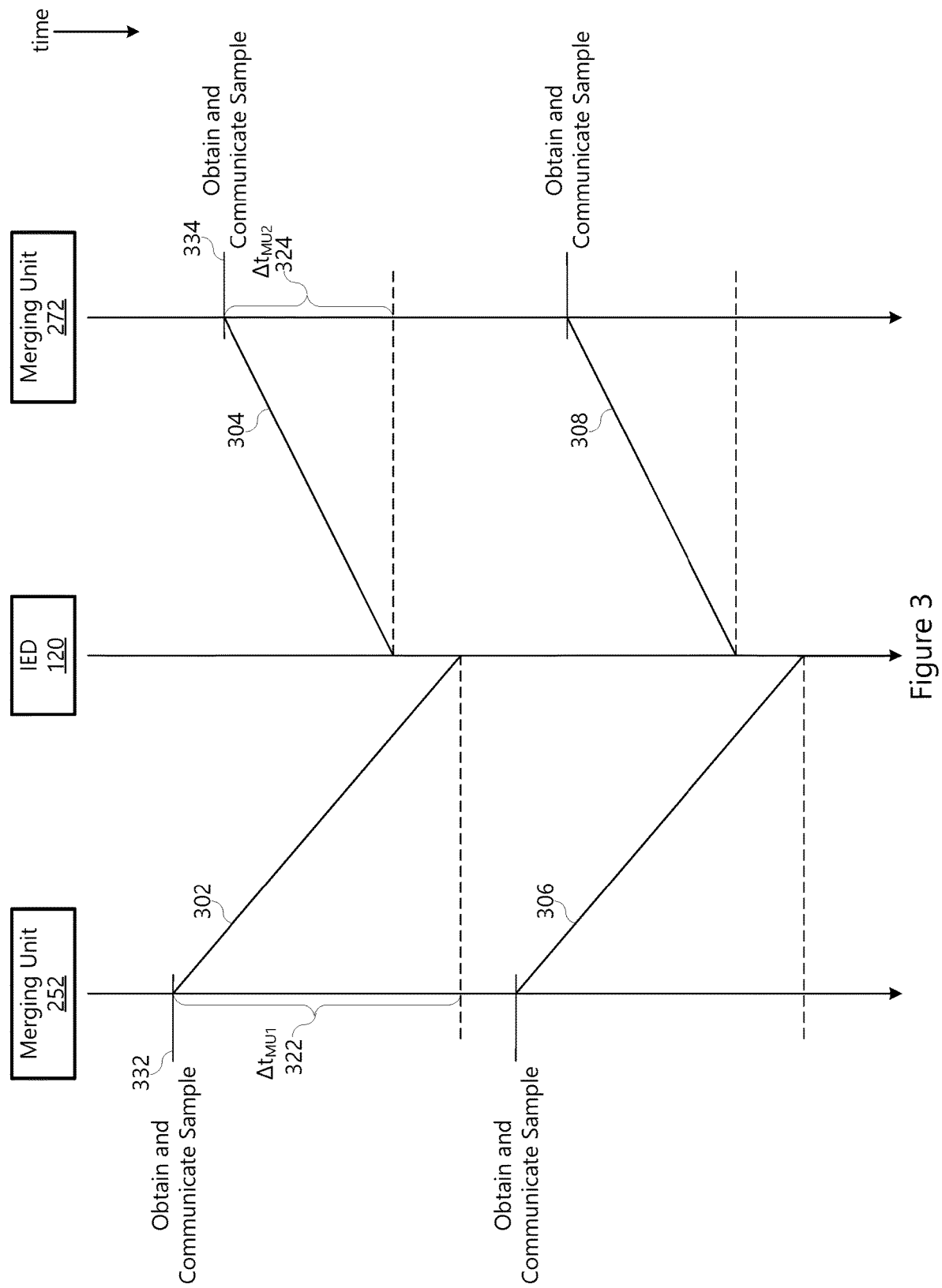
FIG. 3 illustrates timing diagram of communications from merging units arriving at an IED, in accordance with various embodiments.

FIG. 3 illustrates a timing diagram of communications 302, 304, 306, 308 as they are received by the IED 120 from merging units 252 and 272. Due to different processing delays of the merging units 252, 272 and latencies in the communication media 262 and 282, communications from the merging units 252 and 272, may be received at the IED (such as IED 120) at different times. As illustrated, a first sample is made by merging unit 252 at time 332, and sent to IED 120 in communication 302. The communication 302 is received after a delay $\Delta t_{MU1}$ 322. The delay 322 includes the time from the sampling until receipt by the IED 120, and may include latencies native to the merging unit 252 and communication and processing delays to the IED 120. Similarly, a second sample is made by merging unit 272 at time 334, and sent to IED 120. The communication 304 is received after a communication delay $\Delta t_{MU2}$ 324. It should be noted that the delays $\Delta t_{MU1}$ 322 and $\Delta t_{MU2}$ 324 may be different due to minor hardware differences in the merging units, different communication media, and the like.

In order for the IED 120 to properly align the samples included in the communications 302, 304, 306, 308, information about the relative times of sample collection may be used. As is described in further detail herein, instead of including a time stamp with each sample (which would introduce complexity), the merging units in accordance with several embodiments herein include a sample time offset (STO) with each communication, where the sample time offset is related to the communication and processing delay $\Delta t$ from the time that the sample is obtained until the receipt of the communication by the IED 120. Furthermore, in accordance with several embodiments herein, each merging unit maintains accuracy of its associated STO by updating the STO periodically using a return communication from the IED 120. Although only two different merging units are illustrated in this timing diagram, it should be noted that several merging units may provide digitized analog signals to the IED, as suggested in FIG. 1. Given different latencies for the several merging units, it is easy to see how messages may be received by the IED 120 out of the order in which the samples in the messages were obtained from the several merging units.

Figure 4A:
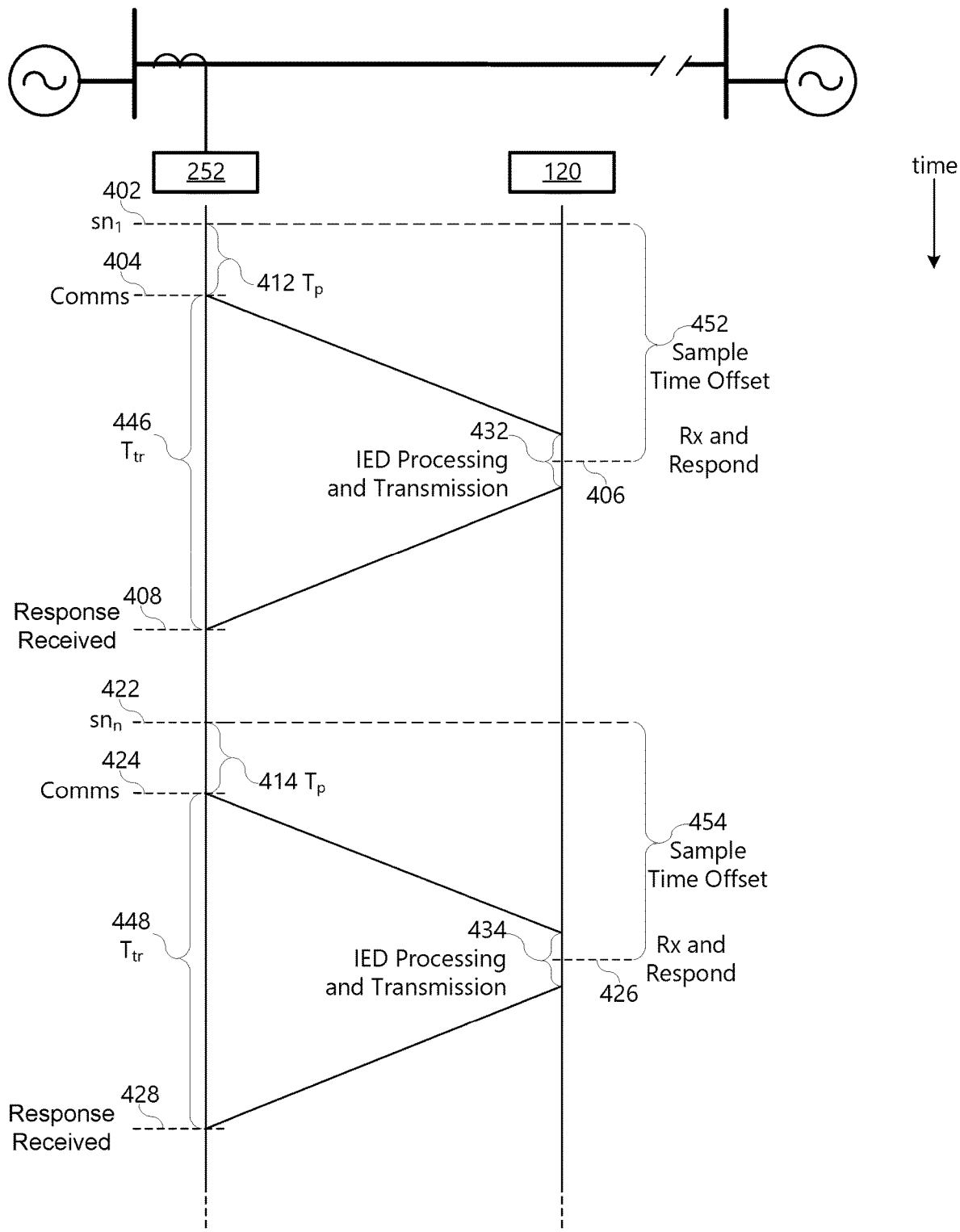
FIG. 4A illustrates a timing diagram of obtaining communication delay times from merging units, in accordance with various embodiments.

FIG. 4A illustrates a communication timing diagram between a merging unit 252 and IED 120 to determine STO of the merging unit 252 to IED 120. In one embodiment, as illustrated, merging unit 252 obtains a sample from the electric power delivery system using, for example, a CT at time $sn_1$ 402. After some processing delay, the merging unit may prepare a packet that includes the sample and a previously-calculated STO at communications time 404. The communications 404 may begin with creating the communications packet and end with the transmission of the message including the sample $sn_1$ to the IED 120. After a delay that may be associated with communication latency, the IED 120 may receive and process the communication and prepare and send a response. The processing and preparation of the response may include a delay. The IED transmits the response, which is received and processed after another communications latency and processing delay at 408. The merging unit may then calculate a new STO and update the STO with the newly calculated STO. The time from the communications at the merging unit 404 to arrival and receipt of the response at 408 may be noted as a communication delay $T_{tr}$ 446. The time between obtaining the sample 402 and the start of the internal communications 404 (e.g. packet preparation) may be noted as the merging unit processing delay $T_p$ 412. In accordance with several embodiments herein, the sample time offset (STO) 452 is related to the merging unit processing delay $T_p$ 412 and the communication delay $T_{tr}$ 446. The communication delay $t_{tr}$ 446 may therefore be used to determine STO.

In accordance with various embodiments, the IED 120 and merging unit 252 may be configured in accordance with a master-slave arrangement. In one such arrangement, the IED 120 is configured to respond to every communication received from the merging unit 252. In certain arrangements, the IED 120 may be configured to respond to less then each communication received from the merging unit 252. Other arrangements and response configurations are within the scope of this disclosure.

The merging unit 252 may be configured to calculate the STO 452 using measured time periods $T_p$ 412 and $T_{tr}$ 446 and/or differences in time stamps of events. The different time periods $T_p$ 412 and $T_{tr}$ 446 may be measured using an internal clock, internal oscillator, external time or timing signal, or the like. The merging unit 252 may calculate the STO as the sum of: half of the communication delay $T_{tr}$ 446; and the merging unit processing delay $T_p$ 412. Such a calculation of STO may assume that the link time $t_{LINK}$ 446 is symmetrical. Equation 1A may be used to calculate STO in accordance with various embodiments:

$$STO = T_p + \frac{T_{tr}}{2} \qquad \text{Eq. 1A}$$

In various embodiments, the $T_{tr}$ 446 may not be symmetrical. For example, a processing delay at the IED 120 may cause the time from communications 404 to receipt 406 at the IED to be longer than the time from receipt 406 at the IED 120 to receipt at the merging unit 408. In such instances, the merging unit 252 may be configured to use another fraction instead of half, or add an additional IED processing offset, such as is illustrated in Equation 1B:

$$STO = T_p + \frac{T_{tr}}{SC} + T_{IED} \qquad \text{Eq. 1B}$$

where:
SC is a channel symmetry constant, which may be 2 for symmetrical communication channel; and
$T_{IED}$ is an IED processing delay time offset.

Figure 4B:
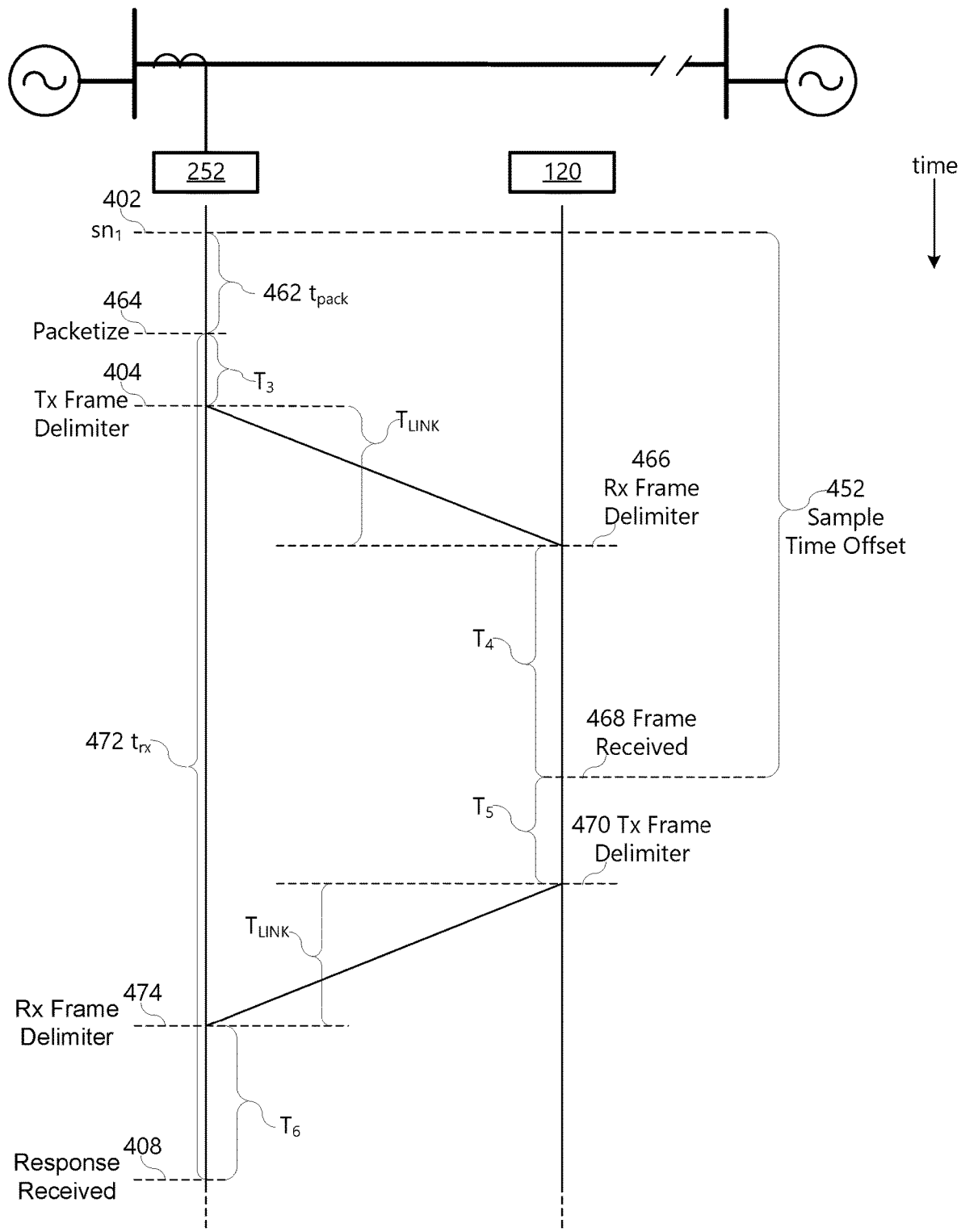
FIG. 4B illustrates a timing diagram of obtaining communication delay times from merging units, in accordance with various embodiments.

In various embodiments a calculation of STO may take into consideration specific delays and processing intervals. FIG. 4B illustrates another timing diagram of a merging unit 252 obtaining, processing and transmitting a communication packet that includes a sample and an STO, along with a timing diagram of an IED 120 receiving the packet and responding to the merging unit 252. Upon a "sample now" sn1 pulse at 402 the merging unit may perform various sampling and processing tasks before creating a packet for transmission at 464 (packetizing operation). The tasks may include various delays such as group delays and hardware delays. The tasks may include a predetermined waiting period for receipt of the sample. The merging unit may monitor the processing delay as time $t_{pack}$ 462 from the sample now pulse 402 and the packetizing 464 using an oscillator, clock, or the like. Once the packet is formed, a time $T_3$ may elapse before the transmission of the Tx frame delimiter 404 to the IED 120.

The IED 120 may receive the packet Rx frame delimiter 466 after an elapsed transmission time $T_{LINK}$ of the frame from the merging unit 252 to the IED 120. The IED may experience a delay $T_4$ from the receipt of the frame delimiter 466 and the receipt of the frame 468. The delay $T_4$ may include reception, processing, and decoding of the transmitted packet. The IED 120 may be configured to send a response packet back to the merging unit. A delay $T_5$ may occur between the receipt of the frame 468 and the transmission of the frame delimiter 470 of the response packet from the IED 120 to the merging unit 252.

The merging unit 252 may then receive the frame delimiter 474 of the response packet from the IED 120 after an elapsed transmission time $T_{LINK}$. The merging unit 252 then receives the response from the IED 120 at 408 after an elapsed time $T_6$ of the frame delimiter receipt 474. The communication delay $t_{rx}$ 472 may be the time from packetization 464 until the time of receipt of the response 408. The communication delay $t_{rx}$ 472 may be used to determine STO.

In various embodiments, the transmission time $T_{LINK}$ may be assumed to be symmetrical for transmission of packets from the merging unit 252 to the IED 120 and transmission of packets from the IED 120 to the merging unit 252. In various other embodiments, the transmission time may not be assumed to be symmetrical, and a correction factor may be applied in calculation of STO.

The merging unit 252 may track the times of various events from the sample now pulse to the receipt of the response 408 from the IED 120. The times may be tracked using a clock, oscillator, or the like. As is indicated, the STO corresponds to a time between obtaining the sample and the receipt of the frame 468 at the IED 120. It should be noted that in certain embodiments a hardware delay may elapse between a "sample now" pulse and the time a sample is obtained. In various embodiments herein, this hardware delay is subtracted from the "sample now" pulse to calculate the STO.

To calculate STO, the merging unit 252 may need to consider processing times and delays of both the merging unit 252 and the IED 120, and the transmission link times $T_{LINK}$. The processing times and delays of the merging unit 252 can be measured by the merging unit 252 using an internal clock or oscillator. The processing times and delays of the IED may be constant over time, and, therefore, may be settings for the merging unit 252, or communicated from the IED 120 to the merging unit 252 at setup time and/or updated periodically. For example, times $t_{pack}$ 462, $T_3$, $t_{rx}$ 472, and $T_6$ may be directly measured by the merging unit 252. Times $T_4$ and $T_5$ may be either settings or provided by the IED 120 to the merging unit 252. Using those quantities, the merging unit 252 may be configured to calculate the STO as illustrated in Equations 2A-2D:

$$T_{DELAY} = \frac{(T_3 + T_4) - (T_5 + T_6)}{2} \qquad \text{Eq. 2A}$$

$$t_{trans} = \frac{t_{rx}}{2} + T_{DELAY} \qquad \text{Eq. 2B}$$

$$\text{STO} = t_{pack} + t_{trans} \qquad \text{Eq. 2C}$$

In various embodiments the STO 452 included in communications from the merging unit 252 to the IED 120 may be a previously-calculated STO, which may be updated from time to time. The STO 452 value may be calculated using quantities calculated from previous cycles of sampling through receipt of a message from the IED. In various other embodiments, the STO 452 value may be calculated using both presently-calculated values and previously-calculated values (values calculated during a previous communication cycle) using, for example, Equation 2C:

$$\text{STO}(n) = t_{pack}(n) + t_{trans}(n-1) \qquad \text{Eq. 2C}$$

where:
STO(n) is the sample time offset value for communication frame n;
$t_{pack}(n)$ is the time $t_{pack}$ 462 from the sample now pulse 402 and the packetizing 464 for communication frame n; and,
$t_{trans}(n-1)$ is the transmission time calculated using Equation 2B for a previous communication frame (n−1).

The calculated STO may be transmitted along with the communication of the sample obtained from the power system. The IED 120 may use the STO along with a time or order of receipt of the communication from the merging unit 252 to align or place the sample in order with other received samples. Indeed, when receiving several samples and different STOs from various merging units, the IED 120 may be configured to align or order the received samples in a manner related to the order that the samples themselves were obtained by the various merging units. In various embodiments, the corrected sample time $T_s$ may be calculated by the IED 120 using the relay time $T_r$ (such as the time that the packet is received 406 by the IED 120) in accordance with Equation 3:

$$T_s = T_r - \text{STO} \qquad \text{Eq. 3}$$

In some embodiments, STO may be calculated once, stored, and used in each message from the merging unit to the IED. However, various delays in processing, communication, and the like may drift over time. Accordingly, in other embodiments, STO may be updated periodically such as on a schedule or whenever a receipt message from the IED is received at the merging unit. The merging unit 252 may then update the STO that it uses in transmissions to the IED 120.

Figure 5:
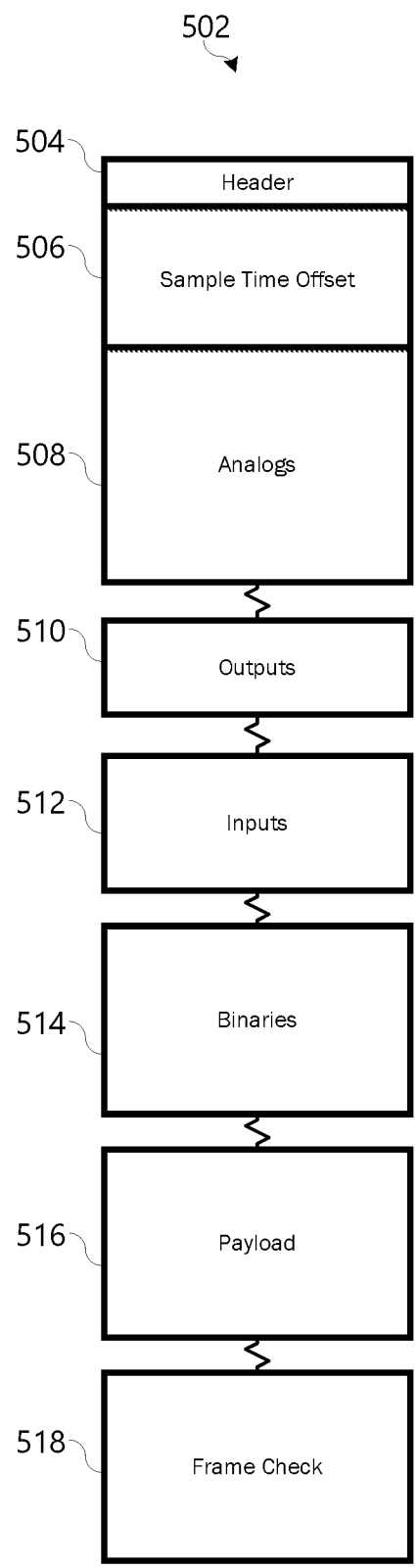
FIG. 5 illustrates a simplified block diagram of a communications packet that includes an analog sample value and a sample time offset.

Upon calculation of STO, the merging unit may include the STO in its messages to the IED 120. FIG. 5 illustrates a simplified block diagram of a communication packet 502 that may be prepared by a merging unit and sent to an IED 120 in accordance with several embodiments herein. In general, the communication packet 502 may include the STO (which may be a previously-calculated STO, such as a STO calculated from the previous sample) along with the sample obtained. The communication packet 502 may include a header 504 that includes information such as a protocol version, operation mode of the merging unit, health of the merging unit, sequence number, unique identifier, and the like. In various embodiments, the merging unit may communicate with the IED in a peer-to-peer architecture, so no address or routing information is needed. In various other embodiments, the merging unit and the IED may be in communication over a network or other communication-switching architecture. In such embodiments, the header may include address and/or other routing information related to the intended destination of the communication.

The packet may include the STO 506. In certain embodiments, the STO 506 calculated as described above, may be stored and transmitted as a number of nanoseconds, microseconds, milliseconds, or the like. In other embodiments, the STO may be in terms of counts instead of in terms of seconds. In various embodiments the STO may be transmitted in a field of a predetermined length. In various other embodiments, the STO field 506 may be longer or shorter to accommodate differently-formatted STO and/or expected offset length.

The packet 502 may include a field that contains analog data 508. The analog data field 508 may include an indicator of the number of analog channels to be transmitted, as well as the channel data. The packet 502 may include a field of outputs 510. The outputs 510 may include states for contact outputs of the merging unit. The packet 502 may include a field of inputs 512, that includes states for contact inputs for the merging unit. A field of binaries 514 may be included in the packet 502. The binaries 514 may include an internal state of a protective relay, such as all or part of a "relay word" to be transmitted to the merging unit.

In various embodiments, the packet may only transmit STO under certain conditions such as in a normal mode. In certain conditions, the packet 502 may be configured without certain fields. For example, in a normal mode, the packet 502 may include STO 506, but not include payload 516. In other modes, the packet 502 may include a payload field 516, but not include STO. The payload may include an exchange of application-specific data. The data may include event reports, diagnostic reports, settings, configuration, firmware updates, and the like. The packet 502 may also include a frame check field 518 that includes a frame check sequence used to detect and/or correct errors that may have been generated during transmission of the frame on the physical media. For example, a 32-bit Bose-Chaudhuri-Hocquenghem ("BCH") code with a Hamming distance may be used, or a cyclic redundancy check ("CRC") such as a CRC-32 Castagnoli polynomial.

Figure 6:
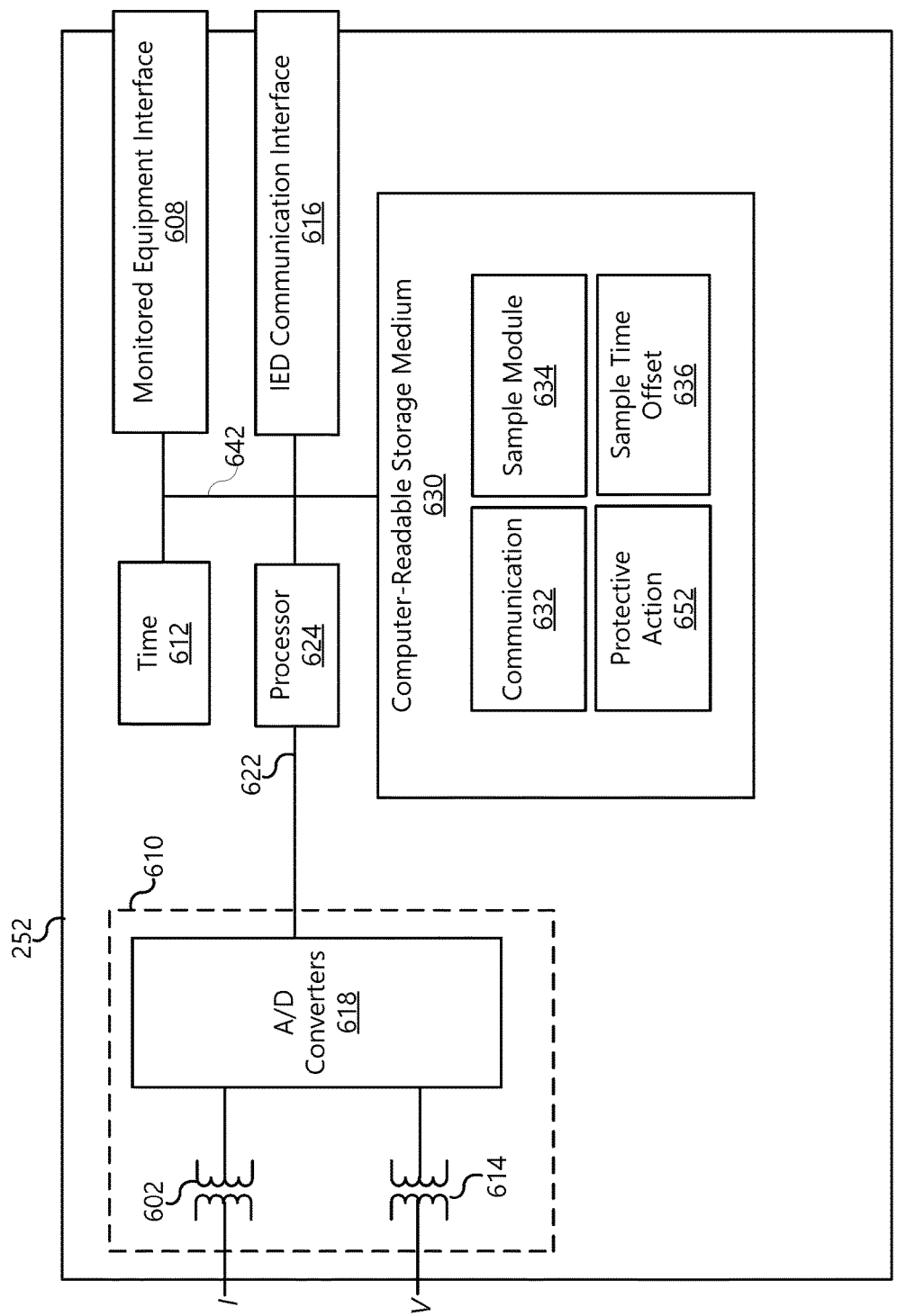
FIG. 6 illustrates a simplified block diagram of a merging unit in accordance with various embodiments.

FIG. 6 illustrates a simplified block diagram of a merging unit 252 that may be used to obtain power system signals and transmit the power system signals to an IED, where the communications to the IED include not only the sample data but also the STO data, in accordance with several embodiments herein. In certain embodiments, the merging unit 252 may obtain electric power system signals from the electric power delivery system directly using a sampling circuit 610. The sampling circuit 610 may receive current and/or voltage signals from instrument transformers of the electric power delivery system, transform the signals to an appropriate level using transformers 602 and 614, sample the signals using A/D converter(s) 618, and communicate the digitized analog signals to a processor 624 using a bus 622.

The merging unit 252 may also include an IED interface 616. The IED interface 616 may include one or more communication ports. The communication ports may be fiber optic ports, or ports that correspond with any applicable communication protocol. The IED interface 616 may be in communication with bus 642 such that communications may be available to the processor 624, and communications may be sent to the IED 120 via IED interface 616.

The processor 624 may be in communication with several other elements of the merging unit 252 using bus 642. The processor 624 may be any applicable processing unit such as a microprocessor, field-programmable gate array (FPGA) or the like. The processor 624 may include resident computer-readable storage media. The processor 624 may be configured to execute instructions that may be stored on computer-readable storage media. In some embodiments, the processor 624 and/or the computer-readable storage medium 630 may generally be referred to as processing circuitry.

The merging unit 252 may include a time module 612 that may provide a time or timing signal on bus 642. The time module 612 may include an internal oscillator or other device for providing the timing signal. In various embodiments, the time module 612 may include an interface to receive an external time signal. In some embodiments, the time module may be synchronized to an external time or timing signal via an interface or via communications from an IED. The merging unit 252 may also include a monitored equipment interface 608 in communication with bus 642. The monitored equipment interface may be in communication with a monitored equipment and capable of sending commands to such equipment and receiving signals from such equipment. For example, the equipment may be a circuit breaker. The monitored equipment interface 608 may obtain status information (open/closed) from the circuit breaker, and may be used by the merging unit 252 to send commands to the monitored equipment such as a trip command and/or a close command.

The merging unit 252 may include a non-transitory computer-readable storage medium 630, such as a memory, in communication with bus 642. As mentioned above, the computer-readable storage medium 630 may be part of or separate from the processor 624. The computer-readable storage medium 630 may include instructions that when executed by the processor cause the merging unit 252 to perform certain functions. The computer-readable storage medium 630 may include a communication module 632 that include instructions related to the communication actions of the merging unit 252. For example, the communications instructions 632 may include instructions that merging unit 252 to send communications to an IED (including, for example, packetizing information in accordance with FIG. 5), interpret communications from an IED, send commands to the monitored equipment or the like. The communications module 632 may cause the merging unit 252 to mark the time that a communication is sent to an IED, and the time that a receipt is received from the IED; or calculate a time between the sending of the communication to the IED and receiving the receipt from the IED. The communication module 632 may include instructions to obtain the STO and include the STO in communications to the IED.

The computer-readable storage medium 630 may include a sample module 634, which may be configured to cause the merging unit 252 to obtain samples. For example, the sample module 634 may instigate a "sample now" signal, which may be on a predetermined schedule or sampling rate, upon lapse of a sampling time, upon receipt of a request for a sample, or the like. The sample module 634 may start a timer or note a time that the sample is obtained. The sample module 634 may cause the recording of the sample obtained from the electric power delivery system using the sampling circuit 610.

The computer-readable storage medium 630 may include a sample time offset module 636 configured to calculate STO in accordance with several embodiments herein. The STO module 636 may use the time that the sample was obtained, the time the communication was sent to the IED, and the time that that the receipt was received from the IED to calculate the STO in accordance with several embodiments herein. In certain embodiments, instead of using event times, the STO module may use counts or lapsed times between events. The STO module 636 may cause storage of the STO for later retrieval and inclusion in communications to the IED. The STO module 636 may include instructions for the calculation and update of the STO every time that a message receipt is received from the IED, and the necessary times are available for STO calculation.

The computer-readable storage medium 630 may include instructions for protective action 652. The protective action module 652 may include instructions for effecting a protective action on the electric power delivery system. For example, upon receipt of a trip command from the IED, the protective action module 652 may signal the monitored equipment interface 608 to activate the trip signal to the circuit breaker.

Figure 7:
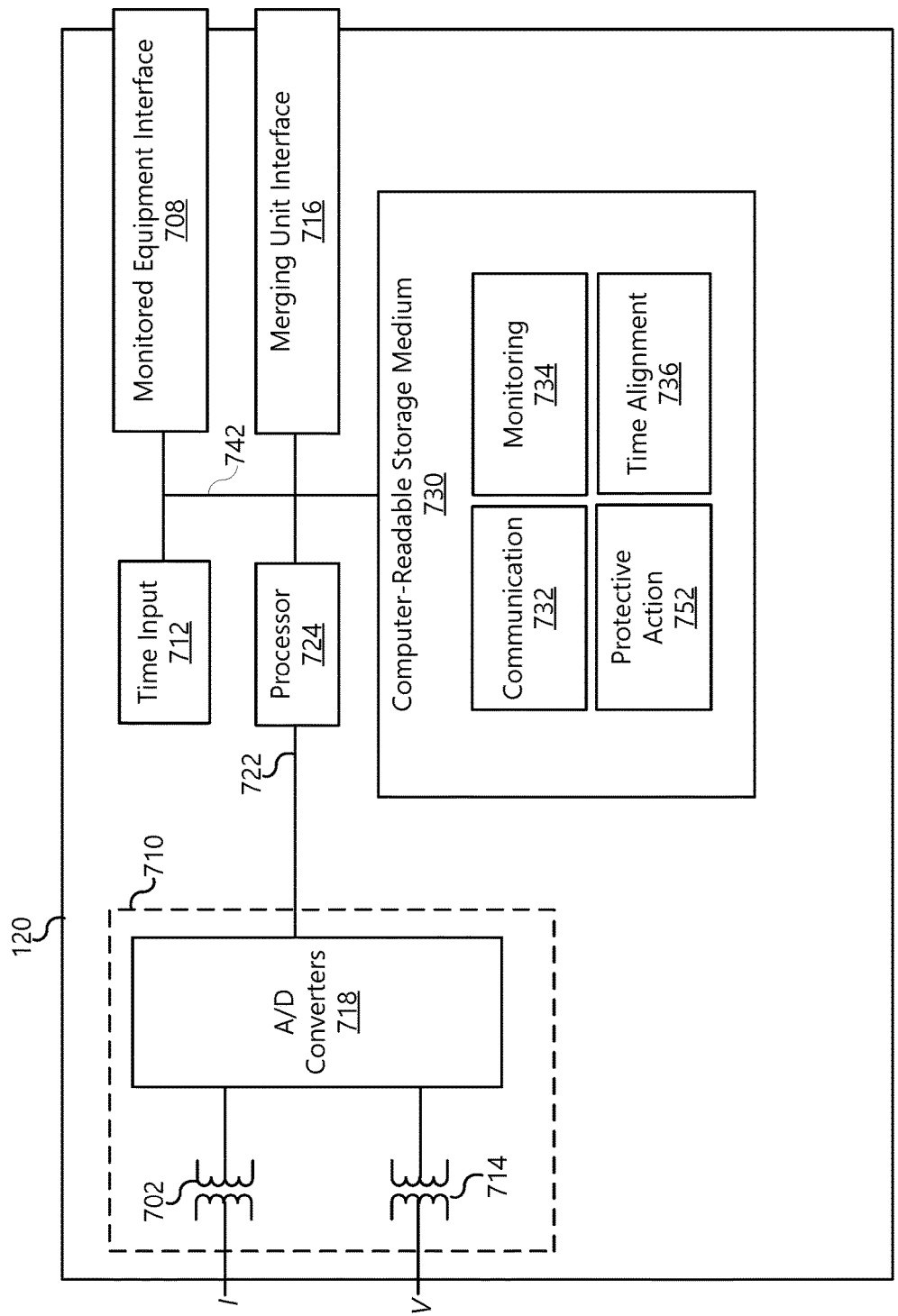
FIG. 7 illustrates a simplified block diagram of an IED in accordance with various embodiments.

FIG. 7 illustrates a simplified block diagram of an IED 120 in accordance with several embodiments herein, configured to receive electric power system samples from one or more merging units, and use the STO values included in messages from the merging units to place sampling values in order related to an order that the samples were obtained from the electric power delivery system. In certain embodiments, the IED 120 may obtain electric power system signals from the electric power delivery system directly using a sampling circuit 710. The sampling circuit may receive current and/or voltage signals from instrument transformers of the electric power delivery system, transform the signals to an appropriate level using transformers 702 and 714, sample the signals using A/D converter(s) 718, and communicate the digitized analog signals to a processor 724 using a bus 722. In several embodiments, such as those disclosed herein, the IED 120 may receive signals from merging unit communications without obtaining measurements directly from the electric power delivery system. In certain embodiments, the IED 120 may obtain measurements directly and obtain measurements from merging unit communications.

IED 120 may also include a merging unit interface 716. The merging unit interface 716 may include multiple communication ports. The communication ports may be fiber optic ports, or ports that correspond with any applicable communication protocol. The merging unit interface 716 may be in communication with bus 742 such that communications may be available to the processor 724, and communications may be sent to merging units via merging unit interface 716.

The processor 724 may be in communication with several other elements of the IED using bus 742. The processor 724 may be any applicable processing unit such as a microprocessor, field-programmable gate array (FPGA) or the like. The processor 724 may include resident computer-readable storage media. The processor 724 may be configured to execute instructions that may be stored on computer-readable storage media. In some embodiments, the processor 724 and/or the computer-readable storage medium 730 may generally be referred to as processing circuitry.

The IED 120 may include a time module 712 if such is used for the monitoring and protection operations of the IED 120. The time module 712 may be a local clock. In some embodiments, the local clock may be synchronized via GNSS, GPS, or the like. The IED 120 may also include a monitored equipment interface 708 in communication with bus 742. The monitored equipment interface may be in communication with a monitored equipment and capable of sending commands to such equipment and receiving signals from such equipment. For example, the equipment may be a circuit breaker. The monitored equipment interface 708 may obtain status information (open/closed) from the circuit breaker, and may be used by the IED 120 to send commands to the monitored equipment such as a trip command and/or a close command.

The IED 120 may include a non-transitory computer-readable storage medium 730, such as a memory, in communication with bus 742. As mentioned above, the computer-readable storage medium 730 may be part of or separate from the processor 724. The computer-readable storage medium 730 may include instructions that when executed by the processor cause the IED 120 to perform certain functions. The computer-readable storage medium 730 may include a communication module 732 that include instructions related to the communication actions of the IED 120. For example, the communications instructions 732 may include instructions that cause IED 120 to send messages to merging units, interpret communications from merging units, send commands to the monitored equipment, receive status information from the merging units, send communications to monitoring systems such as a supervisory control and data acquisition (SCADA) system, or the like.

The computer-readable storage medium 730 may include time alignment and/or arrangement instructions 736 in accordance with several embodiments herein. The time alignment and/or arrangement instructions 736 may cause the IED to associate communications from different merging units with the local time domain of the IED according to a local clock of the IED and communication latencies between the merging units and the IED, as described in the various embodiments herein. That is, the time alignment module 736 may use the time that the communication with a particular sample is received at the IED 120 and the STO included in the message to align the sample with other samples received from various merging units.

The computer-readable storage medium 730 may include instructions for monitoring 734 and for protective action 752. The monitoring 734 may include recording power system conditions, organizing reports such as event reports, and the like. The protective action 752 may include instructions for using the measurements aligned according to the local time domain to detect an event on the power system and take a protective action when warranted. The event may include a fault event, overcurrent event, undervoltage event, or the like. The protective action may include opening a circuit breaker. For example, by associating the measurements with estimated times at which the measurements were taken, the IED 120 may more accurately detect current-over-time events, under-frequency events, among other time-related events. As an example, the protective action may include commanding a particular merging unit to open a particular circuit breaker or multiple circuit breakers based on the time-related event.

Figure 8:
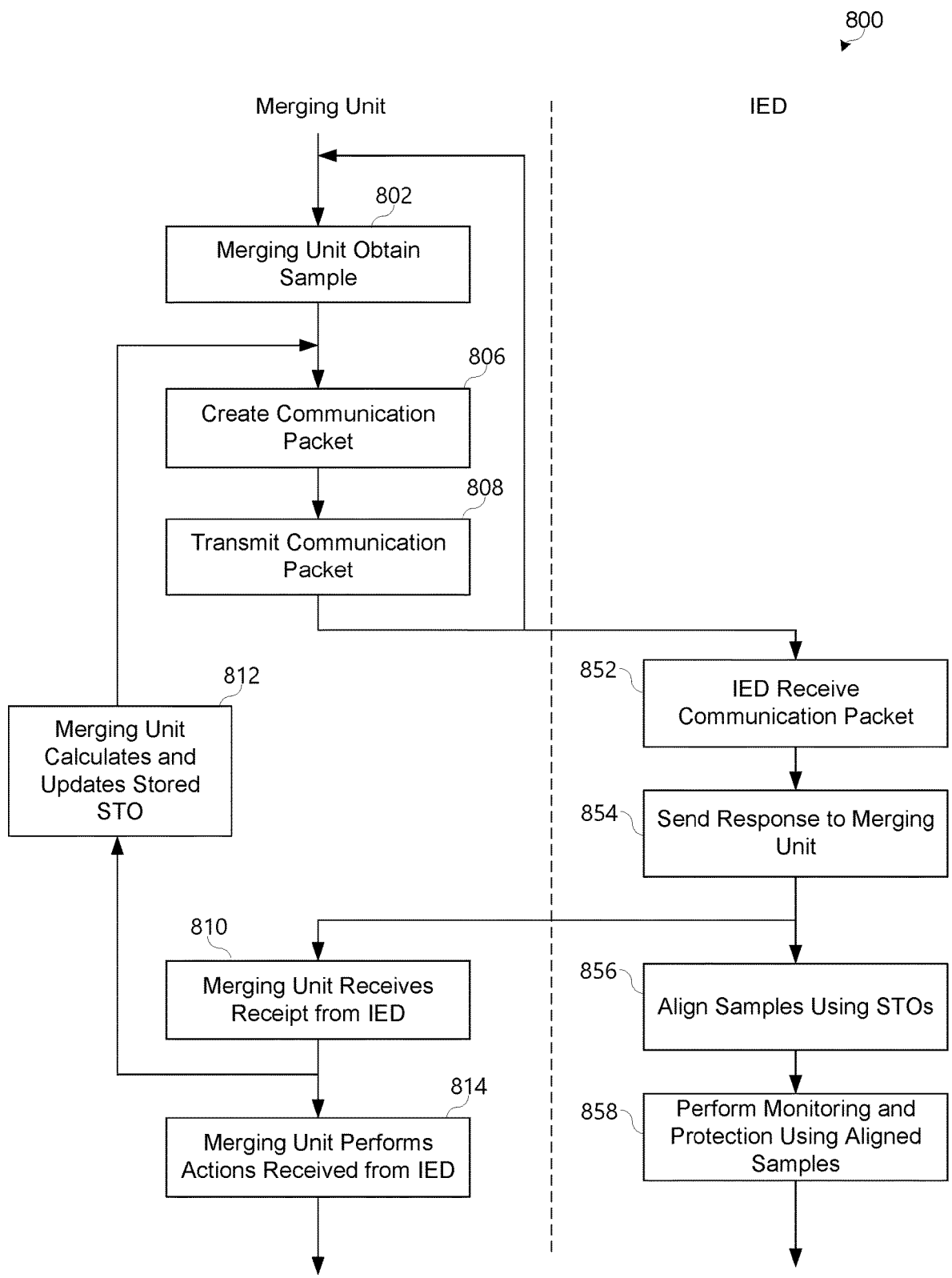
FIG. 8 illustrates a method for time alignment of power system samples in accordance with various embodiments.

FIG. 8 illustrates a flow diagram of a method 800 for time alignment of communicated power system samples in accordance with several embodiments herein. The method may be performed using a merging unit in communication with an IED or other monitoring device. The method starts with the merging unit obtaining a sample from the electric power delivery system 802. The sample may be obtained in accordance with a predetermined sampling schedule or frequency, response to a request for sample or "sample now" command, or the like. The merging unit may mark a time that the sample is obtained, or start a counter (timer, clock, oscillator, or the like) upon obtaining the sample. The merging unit may then determine an STO value in accordance with the embodiments described above, and create a communication packet 806 that includes the sample and the STO value. The merging unit may then transmit the communication packet 808 to a receiving device such as an IED. The merging unit may return to the sampling of the electric power delivery system at 802.

On the IED side, the IED will receive the communication packet from the merging unit at 852, and may be configured to send a response to the merging unit 854. As described above, the IED may determine a time of sampling or a time (or other count or period) since the sample was obtained using the STO associated with the sample. As the IED may receive multiple samples, (either from the merging unit, a plurality of merging units, direct communication with the electric power delivery system, or a combination), the IED may align the samples using the STOs 856 associated with the various samples. With aligned samples, the IED may perform monitoring and protection functions using the aligned samples 858.

Returning to the merging unit, upon receipt of the response from the IED at 810, the merging unit may calculate a new STO, and update the stored STO at 812 (or calculate a new communication delay value for use by the merging unit to determine an STO based on the communication delay and the process delay). The STO may be updated using the time that the sample was obtained, time the sample was sent, and time that the receipt was received from the IED. Instead of times, the merging unit may use a time or count since the previous event. The updated STO may be used in the packet creation and transmission 806, 808. The merging unit also performs any actions that are received from the IED 814. For example, the IED may command the merging unit to trip a circuit breaker. Upon receipt of such protection command, the merging unit may send the trip command to the circuit breaker using, for example, the monitored equipment interface 608.

Systems and methods described above may be used to estimate the time at which a measurement of electrical characteristic occurred in an electric power delivery system without using common timing information. Merging units may measure and track a latency in the period from obtaining the sample to receipt of the sample by the IED, and include the latency (as STO) in communications to the IED. The IED may align samples using STO values associated with the various samples. Accordingly, no external common time source is needed. Furthermore, the IED does not need to track different latencies for each merging unit.

By simplifying the communication between the merging units and the IED (that is, no time stamp is needed to be obtained or sent to the IED), the samples from the merging units may be communicated to the IED with less latency, thereby allowing faster operation of the IED in performing monitoring, control, or protection operations. Further, by accounting for the latency between when the merging unit sends the digitized sample and when the digitized sample is received, the IED may more accurately assess conditions of the electric power delivery system. For instance, IEDs may arrange the digitized samples from merging units according to estimated times at which the measurements were obtained and, upon detecting an event using the arranged digitized samples, the IED may open a circuit breaker to shed load or to shed generation to protect the electric power system.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system for electric power delivery system monitoring, comprising:
a merging unit comprising:
a sampling circuit in electrical communication with the electric power delivery system for obtaining electric power system samples;
a processor operably coupled to the sampling circuit, wherein the processor is configured to:
obtain a sample of the electric power delivery system at a sampling time;
determine a sample time offset value related to a latency between sampling the electric power delivery system and receipt of a communication from the merging unit to an intelligent electronic device (IED);
create a communication packet including the sample and the sample time offset value;
determine a receipt of a response communication from the IED; and,
calculate a communication delay using the receipt of the response communication from the IED; and
a communication interface in operable communication with the processor for transmission of the created communication packet to the IED; and,
an IED in communication with the merging unit for monitoring the electric power delivery system, comprising:
a communication interface in communication with the merging unit for receiving the created communication packet and transmitting the response communication;
a time alignment module for aligning electric power system samples using sample time offset values associated with the samples; and
a protective action module for determining a protective action for the electric power delivery system using the time aligned electric power system samples.

2. The system of claim 1, wherein the sample time offset value comprises a processing delay value and a communication delay value.

3. The system of claim 2, wherein the processor is configured to determine the sample time offset value as a processing delay value associated with the obtained sample and a communication delay value from a previous cycle.

4. The system of claim 2, wherein the processing delay value comprises a time from a sample-now pulse to a packetize operation.

5. The system of claim 2, wherein the communication delay value comprises one-half of a time from transmission of the communication packet to the receipt of the response communication from the IED.

6. The system of claim 2, wherein the communication delay value comprises a function of a time from a packetize operation to the receipt of the response communication from the IED.

7. A merging unit to obtain samples from an electric power delivery system and in communication with an intelligent electronic device (IED), comprising:
a sampling circuit in electrical communication with the electric power delivery system for obtaining electric power system samples;
a processor operably coupled to the sampling circuit, wherein the processor is configured to:
obtain a sample of the electric power delivery system at a sampling time;
determine a sample time offset value related to a latency between sampling the electric power delivery system and receipt of a communication from the merging unit to the IED;
create a communication packet including the sample and the sample time offset value;
determine a receipt of a response communication from the IED; and
calculate a communication delay using the receipt of the response communication from the IED;
a communication interface in communication with the IED for transmission of the created communication packet and receipt of the response communication from the IED.

8. The merging unit of claim 7, wherein the sample time offset value comprises one-half of a communication delay value.

9. The merging unit of claim 7, wherein the sample time offset value comprises a processing delay value and a communication delay value.

10. The merging unit of claim 9, wherein the processor is configured to determine the sample time offset value as a processing delay value associated with the obtained sample and a communication delay value from a previous cycle.

11. The merging unit of claim 9, wherein the processing delay value comprises a time from a sample-now pulse to a packetize operation.

12. The merging unit of claim 11, wherein the processing delay value comprises the time from the sample-now pulse to the packetize operation less a hardware delay time.

13. The merging unit of claim 9, wherein the communication delay value comprises one-half of a time from transmission of the communication packet to the receipt of the response communication from the IED.

14. The merging unit of claim 9, wherein the communication delay value comprises a function of a time from a packetize operation to the receipt of the response communication from the IED.

15. The merging unit of claim 14, wherein the communication delay value is further a function of measured merging unit processing delays.

16. The merging unit of claim 14, wherein the communication delay value is further a function of IED processing delays.

17. The merging unit of claim 14, wherein a communication link transmission time is symmetrical between the merging unit and the IED.

18. A method for monitoring and protecting an electric power delivery system using a merging unit and an intelligent electronic device (IED), comprising:
the merging unit in electrical communication with the electric power delivery system sampling the electric power delivery system;
the merging unit determining a sample time offset value related to a latency between sampling the electric power delivery system and receipt of a communication from the merging unit to the IED;
the merging unit creating a communication packet that includes the sample and the sample time offset value;
the merging unit transmitting the communication packet to the IED;
the IED receiving the communication packet and transmitting a response to the merging unit;

the merging unit receiving the response and updating the sample time offset value; and the IED aligning samples using the sample time offset value.

19. The method of claim 18, wherein determining a sample time offset value comprises summing a processing delay value and a communication delay value.

20. The method of claim 19, wherein the processing delay value is associated with the sample and the communication delay value is associated with a previous cycle.

* * * * *